US012727248B2

(12) United States Patent
He

(10) Patent No.: US 12,727,248 B2
(45) Date of Patent: Sep. 1, 2026

(54) ARRAY SUBSTRATE AND DISPLAY PANEL

(71) Applicant: Shenzhen China Star Optoelectronics Semiconductor Display Technology Co., Ltd., Shenzhen (CN)

(72) Inventor: Wei He, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 363 days.

(21) Appl. No.: 18/399,415

(22) Filed: Dec. 28, 2023

(65) Prior Publication Data

US 2025/0040248 A1 Jan. 30, 2025

(30) Foreign Application Priority Data

Jul. 27, 2023 (CN) ......................... 202310939901.6

(51) Int. Cl.
*H10D 86/60* (2025.01)
*G09G 3/3225* (2016.01)
*H10D 86/40* (2025.01)

(52) U.S. Cl.
CPC ........... *H10D 86/60* (2025.01); *G09G 3/3225* (2013.01); *H10D 86/441* (2025.01); *G09G 2300/0426* (2013.01); *G09G 2300/0842* (2013.01)

(58) Field of Classification Search
CPC ............................ H10D 86/60; G09G 3/3225
See application file for complete search history.

(56) References Cited

U.S. PATENT DOCUMENTS

2018/0166015 A1* 6/2018 Beak .................. H10D 86/0231
2020/0075703 A1* 3/2020 Lee ...................... H10D 86/411
2020/0135825 A1* 4/2020 Cha ...................... G09G 3/3266
2021/0391406 A1* 12/2021 Choi .................... H10K 71/166

* cited by examiner

*Primary Examiner* — Moazzam Hossain
(74) *Attorney, Agent, or Firm* — PV IP PC; Christopher S. Ruprecht; Wei Te Chung

(57) ABSTRACT

The present application provides an array substrate and a display panel, the array substrate includes an underlay substrate and sub-pixels arranged in an array on the underlay substrate. Each sub-pixel at least includes a first transistor, a second transistor, and a storage capacitor. A drain electrode of the first transistor is connected to a gate electrode of the second transistor and is connected to a first electrode plate of the storage capacitor. A drain electrode of the second transistor is connected to a second electrode plate of the storage capacitor. The second electrode plate is disposed opposite to the first electrode plate, and is located on a side of the first electrode plate away from underlay substrate. The present application connects the drain electrode of the second transistor to the second electrode plate of the storage capacitor to detect more defects of the array substrate.

18 Claims, 7 Drawing Sheets

ARRAY SUBSTRATE AND DISPLAY PANEL

CROSS REFERENCE TO RELATED APPLICATIONS

This application claims the priority to Chinese Patent Application No. 202310939901.6, filed on Jul. 27, 2023. The entire disclosures of the above application are incorporated herein by reference.

FIELD OF INVENTION

The present application relates to a field of display technologies, especially to an array substrate and a display panel.

BACKGROUND OF INVENTION

An organic light-emitting diode (OLED) display device possesses self-luminosity, low driving voltage, high luminous efficiency, short response time, high clarity and contrast, nearly 180° viewing angle, wide operating temperature range, and the ability to achieve flexible displays and large area full-color displays, among many advantages. It is widely recognized in the industry as the display device with the most development potential. The pixel driving circuit of a conventional OLED device typically includes a switch thin-film transistor (Switch TFT), a driver thin-film transistor (Driver TFT), and a storage capacitor (Cst). The switch thin-film transistor is controlled by the scanning signal to manage the input of the data signal, the driver thin-film transistor is used to control the current passing through the OLED, and the storage capacitor is generally used to store grayscale voltage to determine the driving current of the driver thin-film transistor.

For top-emission OLED devices, due to the opacity of the pixel electrode, it may block pixel defects. In order to inspect and repair defects in the array manufacturing process, it is usually necessary to perform a comprehensive electrical inspection and repair of defects after the completion of the source-drain electrode layer. Currently, commonly used industry methods for detection include a non-contact shorting bar detection solution. The shorting bar solution primarily detects the voltage signal on the pixel surface to determine the presence of functional defects. However, the shorting bar solution has certain limitations on the area of the detection object, resulting in a limited detection capability.

SUMMARY OF INVENTION

The present application provides an array substrate and a display panel to mitigate a technical issue of the conventional shorting bar solution having a limit to an area of a detection object and a limited detection capability.

To solve the above issue, a technical solution provided by the present application is as follows:

The embodiment of the present application provides an array substrate, comprising an underlay substrate and a plurality of sub-pixels arranged in an array on the underlay substrate;

wherein each of the sub-pixels at least comprises a first transistor, a second transistor, and a storage capacitor;

wherein a drain electrode of the first transistor is connected to a gate electrode of the second transistor, and the drain electrode of the first transistor is connected to a first electrode plate of the storage capacitor;

wherein a drain electrode of the second transistor is connected to a second electrode plate of the storage capacitor, the second electrode plate and the first electrode plate are disposed opposite to each other, and the second electrode plate is located on a side of the first electrode plate away from the underlay substrate.

In the array substrate provided by the embodiment of the present application, the array substrate further comprises a first scan line extending along a first direction and a data line and a first power line extending along a second direction, a source electrode of the first transistor is connected to the data line, a gate electrode of the first transistor is connected to the first scan line, and a source electrode of the second transistor is connected to the first power line.

In the array substrate provided by the embodiment of the present application, the array substrate further comprises:

a first metal layer disposed on a side of the underlay substrate, wherein the first metal layer comprises the first electrode plate and the first power line;

a buffer layer covering the first metal layer away from a side of the underlay substrate;

a semiconductor layer disposed on a side of the buffer layer away from the first metal layer, wherein the semiconductor layer comprises a first active portion of the first transistor, a second active portion of the second transistor, and the second electrode plate;

a gate electrode insulation layer covering the semiconductor layer and the buffer layer; and a second metal layer disposed on a side of the gate electrode insulation layer away from the semiconductor layer, wherein the second metal layer comprises a gate electrode of the first transistor, a gate electrode of the second transistor, and the first scan line;

wherein the first electrode plate is connected between the gate electrode of the second transistor and the drain electrode of the first transistor.

In the array substrate provided by the embodiment of the present application, the first metal layer further comprises a data line, the second metal layer further comprises the source electrode and the drain electrode of first transistor, the source electrode and the drain electrode of the second transistor, the source electrode of the first transistor is connected to the data line and a side of the first active portion, the drain electrode of the first transistor is connected to another side of the first active portion and the first electrode plate; the source electrode of the second transistor is connected to the first power line and an end of the second active portion, the drain electrode of the second transistor is connected to another end of the second active portion and the second electrode plate.

In the array substrate provided by the embodiment of the present application, the second metal layer further comprises a first adaptor line extending along the first direction, and the first adaptor line is connected to the first power line and the source electrode of the second transistor.

In the array substrate provided by the embodiment of the present application, the array substrate further comprises a detective signal line extending along the second direction; the sub-pixel further comprises a third transistor, a source electrode of the third transistor is connected to the detective signal line, and a drain electrode of the third transistor is connected to the drain electrode of the second transistor and the second electrode plate.

In the array substrate provided by the embodiment of the present application, the array substrate further comprises a second scan line extending along the first direction; and the first metal layer further comprises the detective signal line, the second metal layer further comprises the second scan line and the source electrode and the drain electrode of the third transistor, the semiconductor layer further comprises third active portion, the source electrode of the third transistor is connected to the detective signal line and an end if the third active portion, the drain electrode of the third transistor is connected to another end of the third active portion and the second electrode plate.

In the array substrate provided by the embodiment of the present application, the second metal layer further comprises a second adaptor line extending along the first direction and connected to the detective signal line and the source electrode of the third transistor.

In the array substrate provided by the embodiment of the present application, in the first direction, adjacent three of the sub-pixels commonly share the first power line and the detective signal line.

The embodiment of the present application further provides a display panel, comprising the array substrate one of the above embodiments.

The embodiment of the present application further provides an array substrate, comprising an underlay substrate and a plurality of sub-pixels arranged in an array on the underlay substrate;

wherein each of the sub-pixels at least comprises a first transistor, a second transistor, and a storage capacitor;

wherein a drain electrode of the first transistor is connected to a gate electrode of the second transistor, and the drain electrode of the first transistor is connected to a first electrode plate of the storage capacitor;

wherein a drain electrode of the second transistor is connected to a second electrode plate of the storage capacitor, the second electrode plate and the first electrode plate are disposed opposite to each other, and the second electrode plate is located on a side of the first electrode plate away from the underlay substrate;

wherein the array substrate further comprises a first scan line extending along a first direction and a data line and a first power line extending along a second direction, a source electrode of the first transistor is connected to the data line, a gate electrode of the first transistor is connected to the first scan line, and a source electrode of the second transistor is connected to the first power line;

a first metal layer disposed on a side of the underlay substrate, wherein the first metal layer comprises the first electrode plate and the first power line;

a buffer layer covering the first metal layer away from a side of the underlay substrate;

a semiconductor layer disposed on a side of the buffer layer away from the first metal layer, wherein the semiconductor layer comprises a first active portion of the first transistor, a second active portion of the second transistor, and the second electrode plate;

a gate electrode insulation layer covering the semiconductor layer and the buffer layer; and a second metal layer disposed on a side of the gate electrode insulation layer away from the semiconductor layer, wherein the second metal layer comprises a gate electrode of the first transistor, a gate electrode of the second transistor, and the first scan line;

wherein the first electrode plate is connected between the gate electrode of the second transistor and the drain electrode of the first transistor;

wherein the array substrate further comprises a detective signal line extending along the second direction; and the sub-pixel further comprises a third transistor, a source electrode of the third transistor is connected to the detective signal line, and a drain electrode of the third transistor is connected to the drain electrode of the second transistor and the second electrode plate.

In the array substrate provided by the embodiment of the present application, the first metal layer further comprises a data line, the second metal layer further comprises the source electrode and the drain electrode of first transistor, the source electrode and the drain electrode of the second transistor, the source electrode of the first transistor is connected to the data line and a side of the first active portion, the drain electrode of the first transistor is connected to another side of the first active portion and the first electrode plate; the source electrode of the second transistor is connected to the first power line and an end of the second active portion, the drain electrode of the second transistor is connected to another end of the second active portion and the second electrode plate.

In the array substrate provided by the embodiment of the present application, the second metal layer further comprises a first adaptor line extending along the first direction, and the first adaptor line is connected to the first power line and the source electrode of the second transistor.

In the array substrate provided by the embodiment of the present application, the array substrate further comprises a second scan line extending along the first direction; and the first metal layer further comprises the detective signal line, the second metal layer further comprises the second scan line and the source electrode and the drain electrode of the third transistor, the semiconductor layer further comprises third active portion, the source electrode of the third transistor is connected to the detective signal line and an end if the third active portion, the drain electrode of the third transistor is connected to another end of the third active portion and the second electrode plate.

In the array substrate provided by the embodiment of the present application, the second metal layer further comprises a second adaptor line extending along the first direction and connected to the detective signal line and the source electrode of the third transistor.

In the array substrate provided by the embodiment of the present application, in the first direction, adjacent three of the sub-pixels commonly share the first power line and the detective signal line.

Advantages of the present application: In the array substrate and the display panel provided by the present application, the array substrate comprises an underlay substrate and a plurality of sub-pixels arranged in an array on the underlay substrate, wherein each of the sub-pixels at least comprises a first transistor, a second transistor, and a storage capacitor. A drain electrode of the first transistor is connected to a gate electrode of the second transistor, and the drain electrode of the first transistor is connected to a first electrode plate of the storage capacitor. A drain electrode of the second transistor is connected to a second electrode plate of the storage capacitor, the second electrode plate and the first electrode plate are disposed opposite to each other, and the second electrode plate is located on a side of the first electrode plate away from the underlay substrate. The present application connects the drain electrode of the second transistor to the second electrode plate of the storage capacitor such that more defects of the array substrate can be detected via the second electrode plate detects, which improves detection capability, reduces bright spots and dark spots occurring in later processes to mitigate the issue of a conventional shorting bar solution has a limit to an area of a detection object and a limited detection capability.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Figure 1:
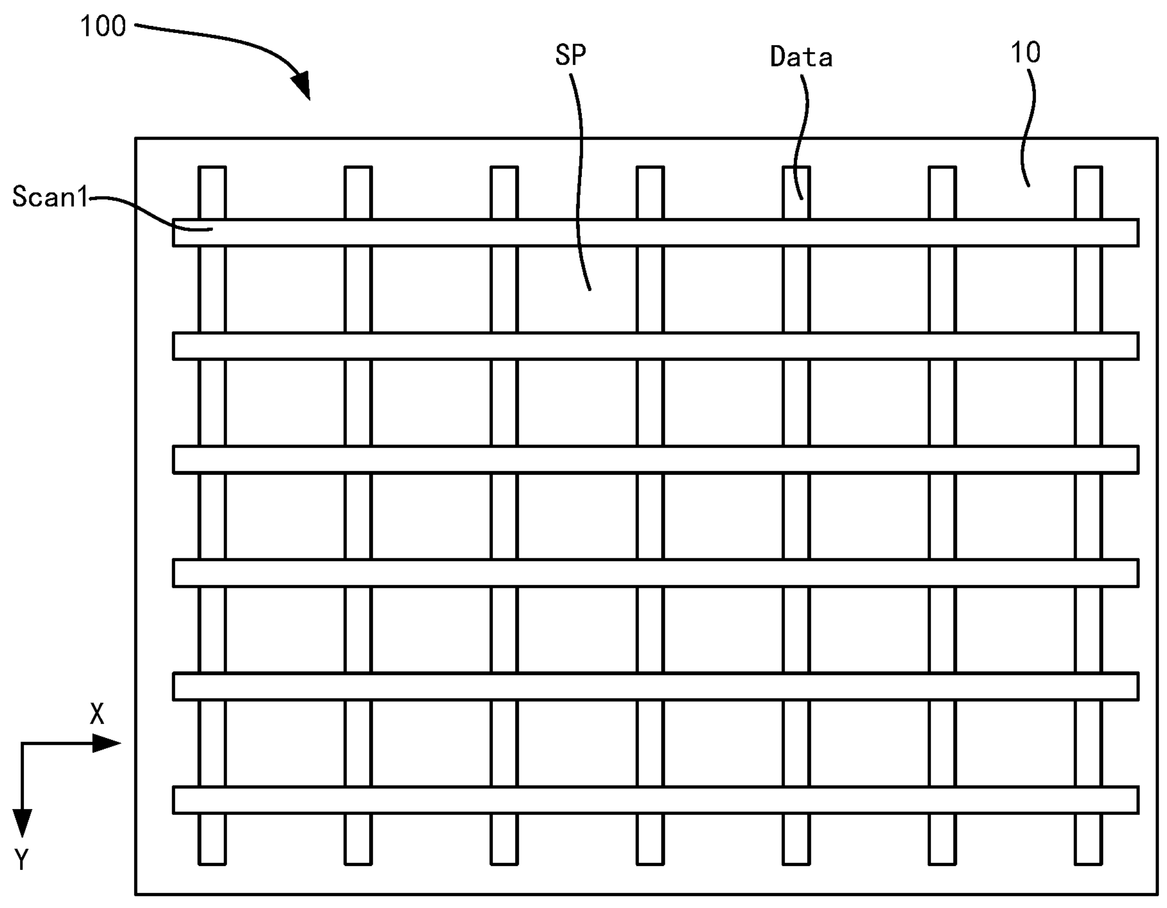
FIG. 1 is a top schematic structural view of an array substrate provided by the embodiment of the present application.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters. In the accompanying drawings, for clear understanding and convenient descriptions, some thicknesses of layers and regions are exaggerated. Namely, a size and a size of each assembly in the accompanying drawings are illustrated arbitrarily, but the present application is not limited thereto.

Figure 2:
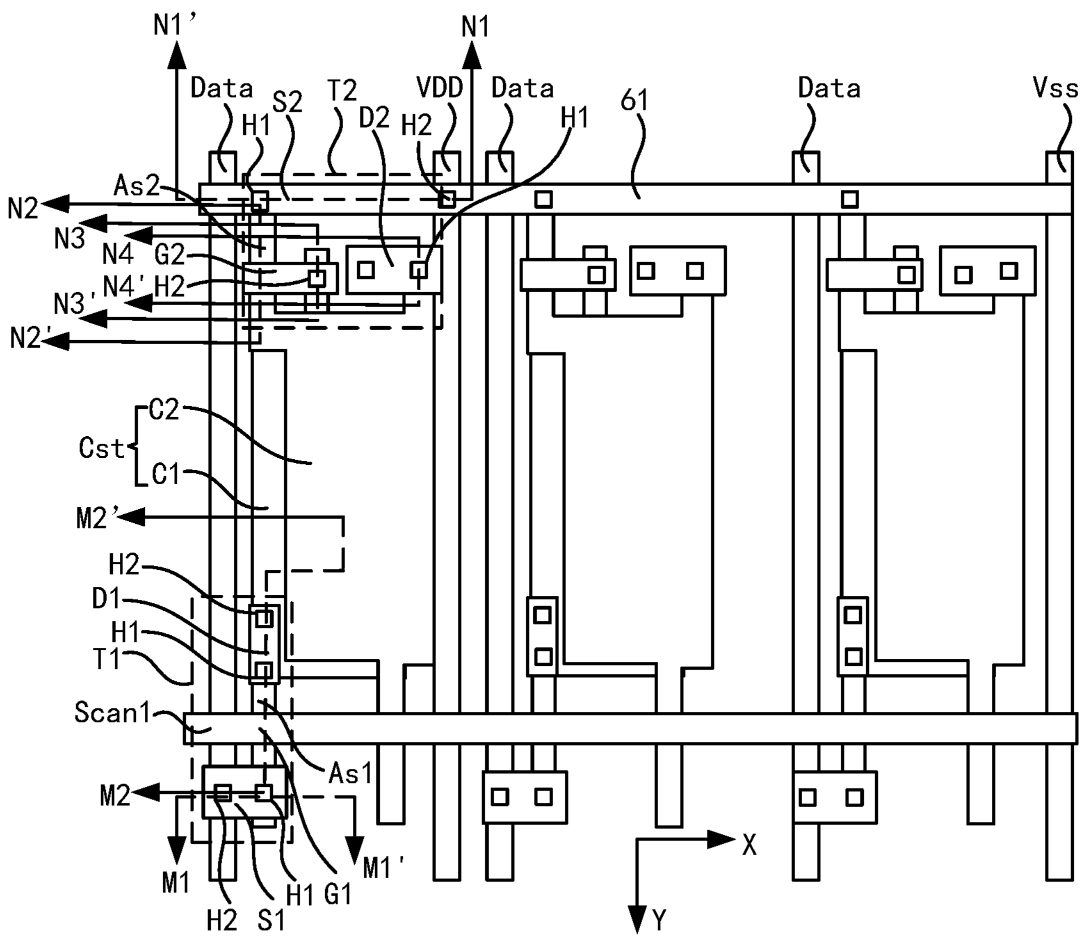
FIG. 2 is a detailed schematic structural view of adjacent three sub-pixels in FIG. 1.
Figure 3:
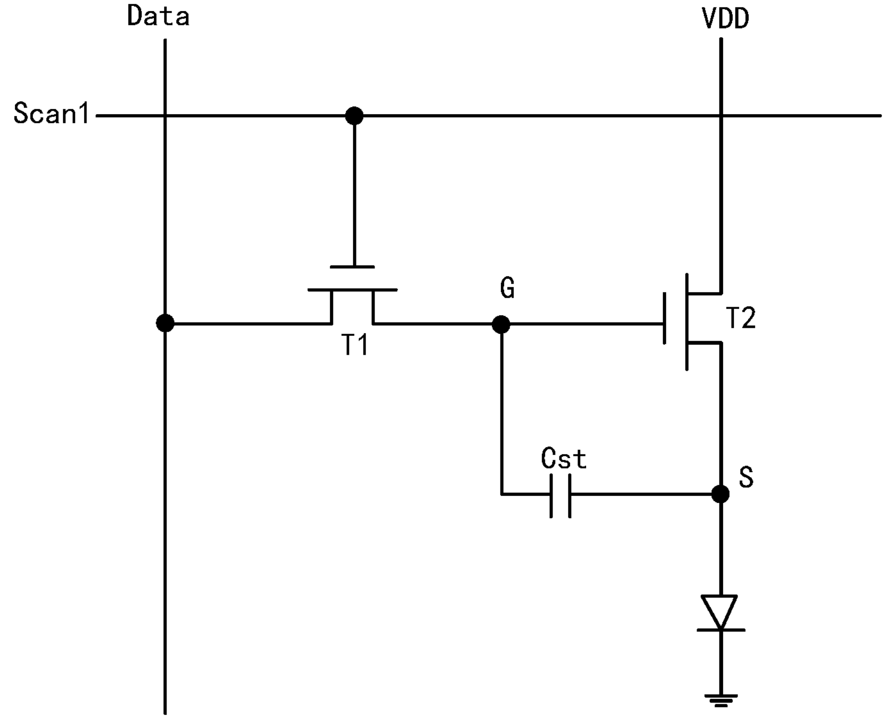
FIG. 3 is a circuit schematic view of one of the sub-pixels in FIG. 2.
Figure 4:
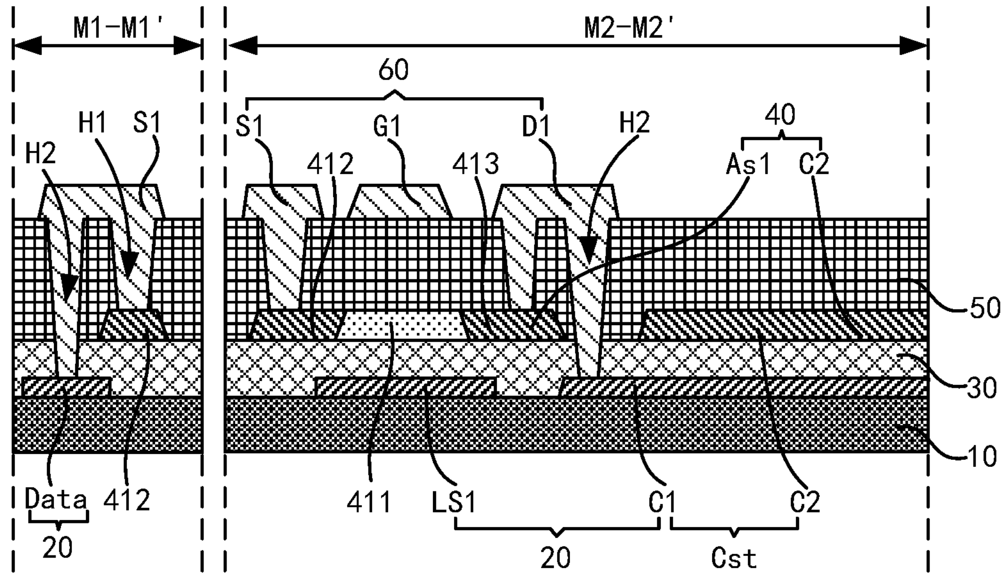
FIG. 4 is a cross-sectional schematic structural view along M1-M1' and M2-M2' directions in FIG. 2.
Figure 5:
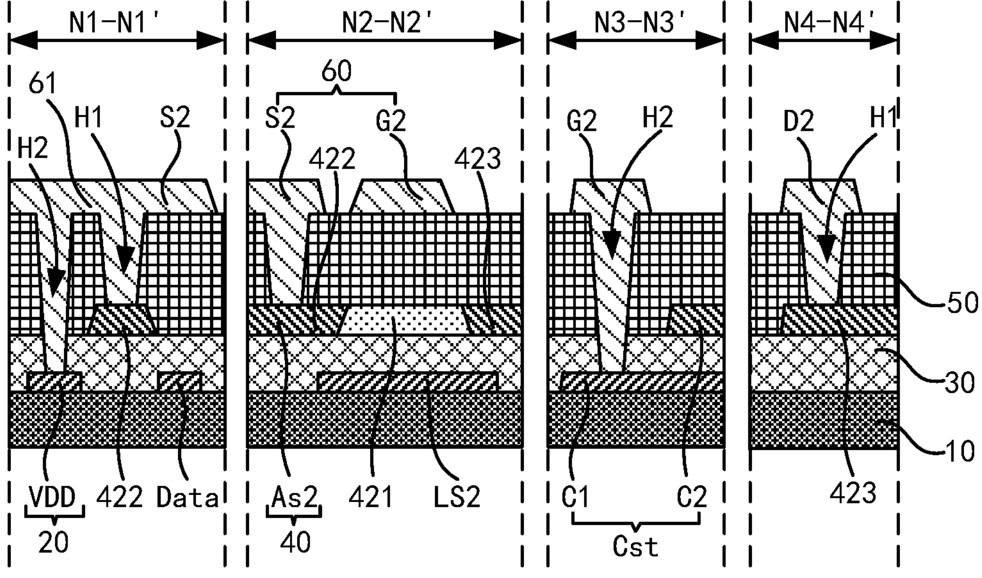
FIG. 5 is a cross-sectional schematic structural view along N1-N1', N2-N2', N3-N3', and N4-N4' directions in FIG. 2.

With reference to FIGS. 1 to 5, FIG. 1 is a top schematic structural view of an array substrate provided by the embodiment of the present application. FIG. 2 is a detailed schematic structural view of adjacent three sub-pixels in FIG. 1. FIG. 3 is a circuit schematic view of one of the sub-pixels in FIG. 2. FIG. 4 is a cross-sectional schematic structural view along M1-M1' and M2-M2' directions in FIG. 2. FIG. 5 is a cross-sectional schematic structural view along N1-N1', N2-N2', N3-N3', and N4-N4' directions in FIG. 2. With reference to FIG. 1, an array substrate 100 comprises an underlay substrate 10 and a plurality of first scan lines Scan1 and a plurality of data lines Data disposed on the underlay substrate 10. The first scan lines Scan1 extend along a first direction X, and are arranged at intervals along a second direction Y. The data lines Data extend along the second direction Y, and are arranged at intervals along the first direction X.

The first direction X is different from the second direction Y. For example, the first direction X is a horizontal direction, and the second direction Y is a vertical direction. The first direction X is perpendicular to the second direction Y, but the present application has no limit thereto. Furthermore, FIG. 1 illustratively shows six first scan lines Scan1 and seven data lines Data, but the present application is not limited thereto. The array substrate 100 of the present application can comprise more or the first scan lines Scan1 and data lines Data.

The first scan lines Scan1 intersect the data lines Data to define a plurality of pixel regions, and one of the sub-pixels SP is disposed in each of the pixel regions. The sub-pixels SP are arranged in an array on the underlay substrate 10.

With reference to FIGS. 2 and 3, each of the sub-pixels SP at least comprises a first transistor T1, a second transistor T2, and a storage capacitor Cst. The first transistor T1 is a switch transistor, and the second transistor T2 is a driver transistor.

A gate electrode G1 of the first transistor T1 is connected to the first scan lines Scan1. A source electrode S1 of the first transistor T1 is connected to the data lines Data. A drain electrode D1 of the first transistor T1 is connected to a gate electrode G2 of the second transistor T2, the drain electrode D1 of the first transistor T1 is connected to a first electrode plate C1 of the storage capacitor Cst. Optionally, the drain electrode D1 of the first transistor T1 is electrically connected to the gate electrode G2 of the second transistor T2 via the first electrode plate C1.

A drain electrode D2 of the second transistor T2 is connected to a second electrode plate C2 of the storage capacitor Cst. The second electrode plate C2 and the first electrode plate C1 are disposed opposite to each other, and the second electrode plate C2 is located on a side of the first electrode plate C1 away from the underlay substrate 10. The array substrate 100 further comprises a first power line VDD extending along second direction Y. A source electrode S2 of the second transistor T2 is connected to the first power line VDD.

Structures of the first transistor T1 and the second transistor T2 will be described specifically as follows.

In particular, with reference to FIGS. 2, 4, and 5, the array substrate 100 further comprises a first metal layer 20, buffer layer 30, a semiconductor layer 40, a gate electrode insulation layer 50, and a second metal layer 60 stacked and disposed on the underlay substrate 10. Optionally, the underlay substrate 10 can be a rigid substrate or a flexible substrate. When the underlay substrate 10 is a rigid substrate, it can comprise a hard substrate such as a glass substrate. When the underlay substrate 10 is a flexible substrate, it can comprise a flexible substrate such as polyimide (PI) thin film and super thin glass thin film.

With reference to FIGS. 2 and 4, the first metal layer 20 is disposed on a side of the underlay substrate 10. The first metal layer 20 comprises the data lines Data, a first electrode plate C1, and a first light shielding portion LS1. Material of the first metal layer 20 comprises one or of metal such as Mo, Al, Ti, and Cu, or a combination thereof.

The buffer layer 30 covers a side of the first metal layer 20 away from the underlay substrate 10. Material of the buffer layer 30 can comprise inorganic material such as silicon oxide, silicon nitride, and silicon oxynitride. The buffer layer 30 can prevent unwanted impurities or contaminants (such as moisture, oxygen, etc.) from diffusing from the underlay substrate 10 to the device, which may be damaged by these impurities or contaminants. At the same time, it can also provide a flat top surface.

The semiconductor layer 40 is disposed on a side of the buffer layer 30 away from the first metal layer 20. The semiconductor layer 40 comprises a first active portion As1 of the first transistor T1 and the second electrode plate C2. The second electrode plate C2 is disposed opposite to the first electrode plate C1, and the buffer layer 30 is disposed between the second electrode plate C2 and the first electrode plate C1. Optionally, the semiconductor layer 40 is an oxide semiconductor layer, and material of the oxide semiconductor layer comprises amorphous oxide semiconductor material such as IGZO, IZO, and IZTO.

The first active portion As1 comprises a first channel 411 and a first source region 412 and a first drain region 413 located on two sides of the first channel 411 respectively. The first source region 412, the first drain region 413, and the second electrode plate C2 are formed by performing conductive treatment to semiconductor material of the semiconductor layer 40. The first light shielding portion LS1 is disposed to correspond to the first channel 411. The first light shielding portion LS1 is configured to shield the first channel 411 to prevent light from irradiating the first channel 411.

The gate electrode insulation layer 50 covers the semiconductor layer 40 and the buffer layer 30. Material of the gate electrode insulation layer 50 can comprise inorganic material such as silicon oxide, silicon nitride, and silicon oxynitride.

The second metal layer 60 is disposed on a side of the gate electrode insulation layer 50 away from the semiconductor layer 40. The second metal layer 60 comprises the gate electrode G1 of the first transistor T1, the source electrode S1 and the drain electrode D1 of the first transistor T1, and the first scan lines Scan1. Material of the second metal layer 60 comprises one of Mo, Al, Ti, and Cu, or a combination thereof.

The source electrode S1 of the first transistor T1 is connected to the data lines Data and the first source region 412. The drain electrode D1 of the first transistor T1 is connected to the first drain region 413 and the first electrode plate C1. The gate electrode G1 of the first transistor T1 is disposed to correspond to the first channel 411.

In particular, a first via hole H1 is defined in the gate electrode insulation layer 50 and penetrates the gate electrode insulation layer 50, and a second via hole H2 is defined in the gate electrode insulation layer 50 and penetrates the gate electrode insulation layer 50 and the buffer layer 30. The source electrode S1 of the first transistor T1 is connected to the first source region 412 via the first via hole H1, and is connected to the data lines Data via the second via hole H2. The drain electrode D1 of the first transistor T1 is connected to the first drain region 413 via the first via hole H1, and is connected to the first electrode plate via the second via hole H2. It should be explained that the present application defines the via hole penetrating the gate electrode insulation layer 50 as the first via hole H1, defines the via hole penetrating the gate electrode insulation layer 50 and the buffer layer 30 as the second via hole H2, and no repeated description is presented later.

With reference to FIGS. 2 and 5, the first metal layer 20 further comprises a first power line VDD and a second light shielding portion LS2. The semiconductor layer 40 further comprises a second active portion As2. The second active portion As2 comprises a second channel 421 and a second source region 422 and a second drain region 423 located on two sides of the second channel 421 respectively. The second light shielding portion LS2 is disposed to correspond to the second channel 421. The second light shielding portion LS2 is configured to shield the second channel 421 to prevent light from irradiating the second channel 421.

The second metal layer 60 further comprises the gate electrode G2, the source electrode S2, and the drain electrode D2 of the second transistor T2. The source electrode S2 of the second transistor T2 is connected to the first power line VDD and the second source region 422. The drain electrode D2 of the second transistor T2 is connected to the second drain region 423. Optionally, the second drain region 423 and the second electrode plate C2 are formed integrally. Namely, a portion of the second electrode plate C2 serves as the second drain region 423.

The gate electrode G2 of the second transistor T2 is disposed to correspond to the second channel 421, and the gate electrode G2 of the second transistor T2 is connected to the first electrode plate C1. Also, the first electrode plate C1 is connected to the drain electrode D1 of the first transistor T1. As such, the gate electrode G2 of the second transistor T2 can be connected to the drain electrode D1 of the first transistor T1 via the first electrode plate C1.

In particular, the gate electrode G2 of the second transistor T2 is connected to the first electrode plate C1 via the second via hole H2. The source electrode S2 of the second transistor T2 is connected to the second source region 422 via the first via hole H1, and is connected to the first power line VDD via the second via hole H2. The drain electrode D2 of the second transistor T2 is connected to the second drain region 423 via the first via hole H1. Namely, the drain electrode D2 of the second transistor T2 is electrically connected to the second electrode plate C2.

Optionally, the second metal layer 60 further comprises a first adaptor line 61. The first adaptor line 61 extends along the first direction X. The first adaptor line 61 is connected to the first power line VDD and the source electrode S2 of the second transistor T2. The first adaptor line 61 and the source electrode S2 of the second transistor T2 are formed integrally. A portion of the first adaptor line 61 can serve as the source electrode S2 of the second transistor T2.

With reference to FIG. 2, of course, the array substrate 100 of the present application further comprises a second power line Vss. The second power line Vss and the first power line VDD can be disposed in the same layer. Namely, the first metal layer 20 further comprises the second power line Vss. The second power line Vss also extends along the second direction Y.

In the present embodiment, the drain electrode D2 of the second transistor T2 is connected to the second electrode plate C2 of the storage capacitor Cst, and the second electrode plate C2 serves as an electrode on the storage capacitor Cst. As such, when a defect of the array substrate 100 is detected by inspecting the second electrode plate C2, it is equivalent to detecting an electric potential of a S point in FIG. 3. Detecting the electric potential of the S point, compared to detecting an electric potential of a G point, can detects more defects of the array substrate 100 to improve a defect detection capability and reduces bright spots and dark spots in a later process, which solve the issue of a conventional shorting bar solution has a limit to an area of a detection object and a limited detection capability.

Figure 6:
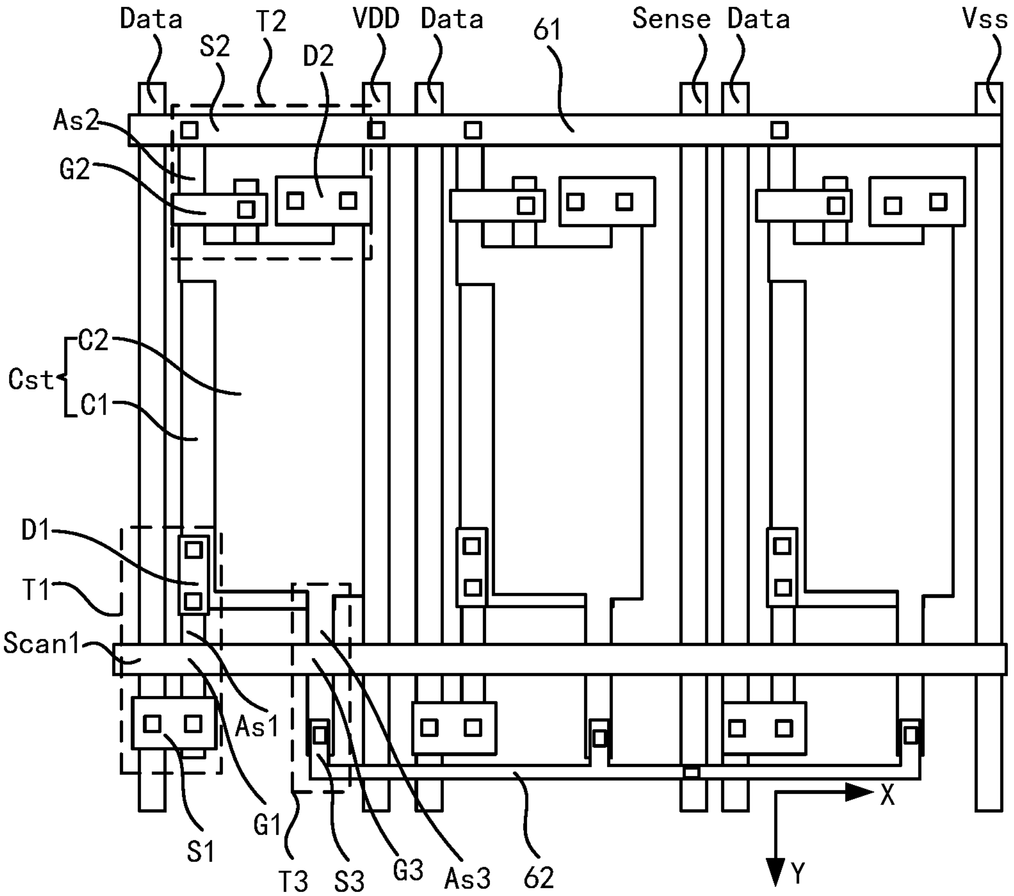
FIG. 6 is another detailed schematic structural view of the adjacent three sub-pixels in FIG. 1.
Figure 7:
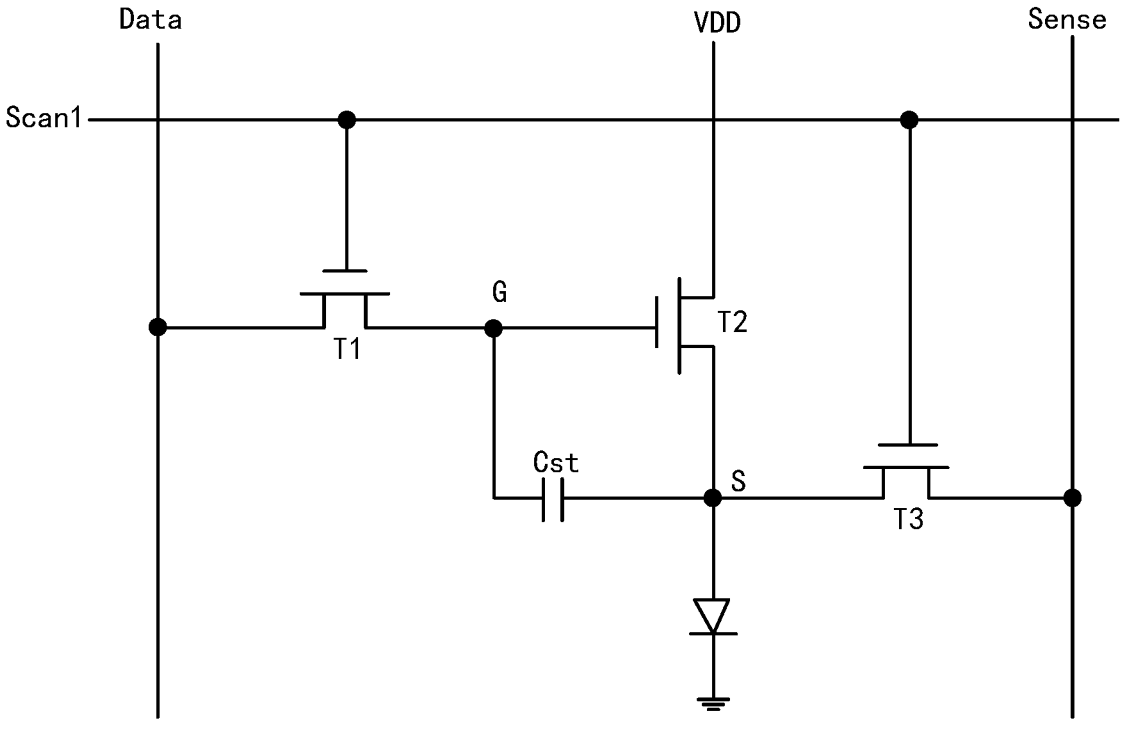
FIG. 7 is a circuit schematic view of one of the sub-pixels in FIG. 6.

In an embodiment, with reference to FIGS. 1 to 7, FIG. 6 is another detailed schematic structural view of the adjacent three sub-pixels in FIG. 1. FIG. 7 is a circuit schematic view of one of the sub-pixels in FIG. 6. A difference from the above embodiment is that with reference to FIGS. 6 and 7, the array substrate 100 further comprises a detective signal line Sense extending along the second direction Y. The sub-pixels SP further comprises a third transistor T3. A source electrode S3 of the third transistor T3 is connected to the detective signal line Sense. A drain electrode of the third transistor T3 (not shown in the figures) is connected to the drain electrode D2 of the second transistor T2 and the second electrode plate C2.

Optionally, the array substrate 100 further comprises a second scan line extending along the first direction X. The second scan line can be the same as or different from the first scan lines Scan1. The embodiment of the present application uses the second scan line the same as the first scan lines Scan1 as an example for explanation. Namely, both a gate electrode G3 of the third transistor T3 and the gate electrode G1 of the first transistor T1 are connected to the first scan lines Scan1. Of course, the second scan line and the first scan lines Scan1 of the present application can be different. When the second scan line is different from the first scan lines Scan1, the gate electrode G1 of the first transistor T1 is connected to the first scan lines Scan1, and the gate electrode G3 of the third transistor T3 is connected to the second scan line.

The second scan line and the first scan lines Scan1 can be disposed in the same layer. The gate electrode G3 of the third transistor T3 and the gate electrode G1 of the first transistor T1 are disposed in the same layer. A source electrode S3 of the third transistor T3 and the source electrode S1 of the first transistor T1 are disposed in the same layer. Namely, the second metal layer 60 further comprises the second scan line and the gate electrode G3 and the source electrode S3 of the third transistor T3.

The detective signal line Sense and the data lines Data are disposed in the same layer. Namely, the first metal layer 20 further comprises the detective signal line Sense, Optionally, the second metal layer 60 further comprises second adaptor line 62, the second adaptor line 62 extends along the first direction X. The second adaptor line 62 is connected to the detective signal line Sense and the source electrode S3 of the third transistor T3.

A third active portion As3 of the third transistor T3 and the first active portion As1 of the first transistor T1 are disposed in the same layer. Namely, the semiconductor layer 40 further comprises a third active portion As3, the source electrode S3 of the third transistor T3 is connected to the detective signal line Sense and an end of the third active portion As3, the drain electrode of the third transistor T3 is connected to another end of the third active portion As3 and the second electrode plate C2.

It should be explained that "disposed in the same layer" of the present application means that in a manufacturing process, a film layer formed by the same material is patterned to obtain at least two different structures, then the at least two different structures are disposed in the same layer. For example, the detective signal line Sense and the data lines Data of the present embodiment are obtained by patterning the same conductive film layer, then the detective signal line Sense and the data lines Data are disposed in the same layer.

In an embodiment, with reference to FIG. 6, in the first direction X, adjacent three of the sub-pixels SP commonly share the first power line VDD and the detective signal line Sense. Other descriptions please refer to the above embodiments, and no repeated description is here.

Based on the same invention conception, the embodiment of the present application further provides a display panel, the display panel comprises the array substrate of one of the above embodiments.

It can be understood according to the embodiments:

In an array substrate and a display panel provided by the present application, the array substrate comprises an underlay substrate and a plurality of sub-pixels arranged in an array on the underlay substrate, wherein each of the sub-pixels at least comprises a first transistor, a second transistor, and a storage capacitor. A drain electrode of the first transistor is connected to a gate electrode of the second transistor, and the drain electrode of the first transistor is connected to a first electrode plate of the storage capacitor. A drain electrode of the second transistor is connected to a second electrode plate of the storage capacitor, the second electrode plate and the first electrode plate are disposed opposite to each other, and the second electrode plate is located on a side of the first electrode plate away from the underlay substrate. The present application connects the drain electrode of the second transistor to the second electrode plate of the storage capacitor such that more defects of the array substrate can be detected via the second electrode plate detects, which improves detection capability, reduces bright spots and dark spots occurring in later processes to mitigate the issue of a conventional shorting bar solution has a limit to an area of a detection object and a limited detection capability.

In the above-mentioned embodiments, the descriptions of the various embodiments are focused. For the details of the embodiments not described, reference may be made to the related descriptions of the other embodiments.

The embodiments of the present application are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments or equivalently replace some of the technical features. These modifications or replacements do not make the essence of the technical solutions depart from a range of the technical solutions of the embodiments of the present application.

What is claimed is:

1. An array substrate, comprising an underlay substrate and a plurality of sub-pixels arranged in an array on the underlay substrate;

wherein each of the sub-pixels at least comprises a first transistor, a second transistor, and a storage capacitor;

wherein a drain electrode of the first transistor is connected to a gate electrode of the second transistor, and the drain electrode of the first transistor is connected to a first electrode plate of the storage capacitor;

wherein a drain electrode of the second transistor is connected to a second electrode plate of the storage capacitor, the second electrode plate and the first electrode plate are disposed opposite to each other, and the second electrode plate is located on a side of the first electrode plate away from the underlay substrate;

wherein the array substrate further comprises:

a first metal layer disposed on a side of the underlay substrate, wherein the first metal layer comprises the first electrode plate and a first power line;

a buffer layer covering the first metal layer away from a side of the underlay substrate;

a semiconductor layer disposed on a side of the buffer layer away from the first metal layer, wherein the semiconductor layer comprises a first active portion of the first transistor, a second active portion of the second transistor, and the second electrode plate;

a gate electrode insulation layer covering the semiconductor layer and the buffer layer; and a second metal layer disposed on a side of the gate electrode insulation layer away from the semiconductor layer, wherein the second metal layer comprises a gate electrode of the first transistor, a gate electrode of the second transistor, and a first scan line;

wherein the first electrode plate is connected between the gate electrode of the second transistor and the drain electrode of the first transistor.

2. The array substrate according to claim 1, further comprising a data line, wherein the first scan line extends along a first direction and the data line and the first power line extend along a second direction, a source electrode of the first transistor is connected to the data line, a gate electrode of the first transistor is connected to the first scan line, and a source electrode of the second transistor is connected to the first power line.

3. The array substrate according to claim 2, wherein the first metal layer further comprises the data line, the second metal layer further comprises the source electrode and the drain electrode of the first transistor, the source electrode and the drain electrode of the second transistor, the source electrode of the first transistor is connected to the data line and a side of the first active portion, the drain electrode of the first transistor is connected to another side of the first active portion and the first electrode plate; the source electrode of the second transistor is connected to the first power line and an end of the second active portion, the drain electrode of the second transistor is connected to another end of the second active portion and the second electrode plate.

4. The array substrate according to claim 3, wherein the second metal layer further comprises a first adaptor line extending along the first direction, and the first adaptor line is connected to the first power line and the source electrode of the second transistor.

5. The array substrate according to claim 2, wherein the array substrate further comprises a detective signal line extending along the second direction; and the sub-pixel further comprises a third transistor, a source electrode of the third transistor is connected to the detective signal line, and a drain electrode of the third transistor is connected to the drain electrode of the second transistor and the second electrode plate.

6. The array substrate according to claim 5, wherein the array substrate further comprises a second scan line extending along the first direction; and the first metal layer further comprises the detective signal line, the second metal layer further comprises the second scan line and the source electrode and the drain electrode of the third transistor, the semiconductor layer further comprises third active portion, the source electrode of the third transistor is connected to the detective signal line and an end of the third active portion, the drain electrode of the third transistor is connected to another end of the third active portion and the second electrode plate.

7. The array substrate according to claim 6, wherein the second metal layer further comprises a second adaptor line extending along the first direction and connected to the detective signal line and the source electrode of the third transistor.

8. The array substrate according to claim 5, wherein in the first direction, adjacent three of the sub-pixels commonly share the first power line and the detective signal line.

9. An array substrate, comprising an underlay substrate and a plurality of sub-pixels arranged in an array on the underlay substrate;

wherein each of the sub-pixels at least comprises a first transistor, a second transistor, and a storage capacitor;

wherein a drain electrode of the first transistor is connected to a gate electrode of the second transistor, and the drain electrode of the first transistor is connected to a first electrode plate of the storage capacitor;

wherein a drain electrode of the second transistor is connected to a second electrode plate of the storage capacitor, the second electrode plate and the first electrode plate are disposed opposite to each other, and the second electrode plate is located on a side of the first electrode plate away from the underlay substrate;

wherein the array substrate further comprises a first scan line extending along a first direction and a data line and a first power line extending along a second direction, a source electrode of the first transistor is connected to the data line, a gate electrode of the first transistor is connected to the first scan line, and a source electrode of the second transistor is connected to the first power line;

a first metal layer disposed on a side of the underlay substrate, wherein the first metal layer comprises the first electrode plate and the first power line;

a buffer layer covering the first metal layer away from a side of the underlay substrate;

a semiconductor layer disposed on a side of the buffer layer away from the first metal layer, wherein the semiconductor layer comprises a first active portion of the first transistor, a second active portion of the second transistor, and the second electrode plate;

a gate electrode insulation layer covering the semiconductor layer and the buffer layer; and a second metal layer disposed on a side of the gate electrode insulation layer away from the semiconductor layer, wherein the second metal layer comprises a gate electrode of the first transistor, a gate electrode of the second transistor, and the first scan line;

wherein the first electrode plate is connected between the gate electrode of the second transistor and the drain electrode of the first transistor;

wherein the array substrate further comprises a detective signal line extending along the second direction; and the sub-pixel further comprises a third transistor, a source electrode of the third transistor is connected to the detective signal line, and a drain electrode of the third transistor is connected to the drain electrode of the second transistor and the second electrode plate.

10. The array substrate according to claim 9, wherein the first metal layer further comprises a data line, the second metal layer further comprises the source electrode and the drain electrode of the first transistor, the source electrode and the drain electrode of the second transistor, the source electrode of the first transistor is connected to the data line and a side of the first active portion, the drain electrode of the first transistor is connected to another side of the first active portion and the first electrode plate; the source electrode of the second transistor is connected to the first power line and an end of the second active portion, the drain electrode of the second transistor is connected to another end of the second active portion and the second electrode plate.

11. The array substrate according to claim 10, wherein the second metal layer further comprises a first adaptor line extending along the first direction, and the first adaptor line is connected to the first power line and the source electrode of the second transistor.

12. The array substrate according to claim 9, wherein the array substrate further comprises a second scan line extending along the first direction; and the first metal layer further comprises the detective signal line, the second metal layer further comprises the second scan line and the source electrode and the drain electrode of the third transistor, the semiconductor layer further comprises third active portion, the source electrode of the third transistor is connected to the detective signal line and an end of the third active portion, the drain electrode of the third transistor is connected to another end of the third active portion and the second electrode plate.

13. The array substrate according to claim 12, wherein the second metal layer further comprises a second adaptor line extending along the first direction and connected to the detective signal line and the source electrode of the third transistor.

14. The array substrate according to claim 9, wherein in the first direction, adjacent three of the sub-pixels commonly share the first power line and the detective signal line.

15. A display panel, comprising an array substrate, and the array substrate comprising an underlay substrate and a plurality of sub-pixels arranged in an array on the underlay substrate;

wherein each of the sub-pixels at least comprises a first transistor, a second transistor, and a storage capacitor;

wherein a drain electrode of the first transistor is connected to a gate electrode of the second transistor, and the drain electrode of the first transistor is connected to a first electrode plate of the storage capacitor;

wherein a drain electrode of the second transistor is connected to a second electrode plate of the storage capacitor, the second electrode plate and the first electrode plate are disposed opposite to each other, and the second electrode plate is located on a side of the first electrode plate away from the underlay substrate;

wherein the array substrate further comprises:

a first metal layer disposed on a side of the underlay substrate, wherein the first metal layer comprises the first electrode plate and a first power line;

a buffer layer covering the first metal layer away from a side of the underlay substrate;

a semiconductor layer disposed on a side of the buffer layer away from the first metal layer, wherein the semiconductor layer comprises a first active portion of the first transistor, a second active portion of the second transistor, and the second electrode plate;

a gate electrode insulation layer covering the semiconductor layer and the buffer layer; and a second metal layer disposed on a side of the gate electrode insulation layer away from the semiconductor layer, wherein the second metal layer comprises a gate electrode of the first transistor, a gate electrode of the second transistor, and a first scan line;

wherein the first electrode plate is connected between the gate electrode of the second transistor and the drain electrode of the first transistor.

16. The display panel according to claim 15, further comprising a data line, wherein the first scan line extends along a first direction and the data line and the first power line extend along a second direction, a source electrode of the first transistor is connected to the data line, a gate electrode of the first transistor is connected to the first scan line, and a source electrode of the second transistor is connected to the first power line.

17. The display panel according to claim 16, wherein the first metal layer further comprises the data line, the second metal layer further comprises the source electrode and the drain electrode of the first transistor, the source electrode and the drain electrode of the second transistor, the source electrode of the first transistor is connected to the data line and a side of the first active portion, the drain electrode of the first transistor is connected to another side of the first active portion and the first electrode plate; the source electrode of the second transistor is connected to the first power line and an end of the second active portion, the drain electrode of the second transistor is connected to another end of the second active portion and the second electrode plate.

18. The display panel according to claim 17, wherein the second metal layer further comprises a first adaptor line extending along the first direction, and the first adaptor line is connected to the first power line and the source electrode of the second transistor.

* * * * *